(12) United States Patent
Sawada

(10) Patent No.: US 6,770,544 B2
(45) Date of Patent: Aug. 3, 2004

(54) SUBSTRATE CUTTING METHOD

(75) Inventor: Hiroshi Sawada, Kusatsu (JP)

(73) Assignee: NEC Machinery Corporation, Shiga-Ken (JP)

( * ) Notice: Subject to any disclaimer, the term of this patent is extended or adjusted under 35 U.S.C. 154(b) by 0 days.

(21) Appl. No.: 10/084,761

(22) Filed: Feb. 20, 2002

(65) Prior Publication Data

US 2002/0115235 A1 Aug. 22, 2002

(30) Foreign Application Priority Data

Feb. 21, 2001 (JP) ........................................ 2001-045134

(51) Int. Cl.⁷ .......................... H01L 21/46; H01L 21/78; H01L 21/301
(52) U.S. Cl. ........................................ 438/462; 438/463
(58) Field of Search .................... 438/462, 463, 438/FOR 386

(56) References Cited

U.S. PATENT DOCUMENTS

| | | | | |
|---|---|---|---|---|
| 3,824,678 A | * | 7/1974 | Harris et al. ........... | 219/121.73 |
| 4,169,976 A | * | 10/1979 | Cirri ..................... | 219/121.72 |
| 5,916,460 A | * | 6/1999 | Imoto et al. ............ | 219/121.67 |
| 6,159,832 A | * | 12/2000 | Mayer .................... | 438/584 |
| 6,261,919 B1 | * | 7/2001 | Omizo .................... | 438/113 |
| 6,333,485 B1 | * | 12/2001 | Haight et al. .......... | 219/121.68 |
| 6,365,443 B1 | * | 4/2002 | Hagiwara et al. ....... | 438/110 |
| 6,376,797 B1 | * | 4/2002 | Piwczyk et al. ........ | 219/121.72 |
| 6,440,773 B1 | * | 8/2002 | Usami .................... | 438/107 |

FOREIGN PATENT DOCUMENTS

| | | | | | |
|---|---|---|---|---|---|
| JP | 55046579 A | * | 4/1980 | ........... | H01L/21/66 |
| JP | 55151351 A | * | 11/1980 | ........... | H01L/21/78 |
| JP | 05166926 A | * | 7/1993 | ........... | H01L/21/78 |

* cited by examiner

*Primary Examiner*—George Fourson
*Assistant Examiner*—Michelle Estrada
(74) *Attorney, Agent, or Firm*—J. C. Patents

(57) ABSTRACT

A substrate, such as a semiconductor wafer, is cut without using a dicer or an adhesive sheet.

A semiconductor wafer 1 formed with a number of elements 2 is drawn and held by an x-y table 4, and ultrashort pulse laser 7 having a pulse width of not more than 1 picosecond is irradiated along scribed lines between the elements 2 to cut the same.

15 Claims, 13 Drawing Sheets

$\tau$ =120fs, $\lambda$ =800nm, N=18

W.D.=100mm, f=100mm, E=0.01mJ/pulse

τ =120fs,   λ =800nm,   N=18
W.D.=100mm,   f=100mm,   E=0.01mJ/pulse

SUBSTRATE CUTTING METHOD

BACKGROUND OF THE INVENTION

1. Field of the Invention

The present invention relates to a substrate cutting method and particularly it relates to a substrate cutting method suitable for cutting a semiconductor wafer having a number of elements formed therein to produce semiconductor pellets.

2. Brief Description of the Prior Art

Semiconductor devices are produced, generally, by forming a number of elements (including integrated circuits; hereinafter the same) in a semiconductor wafer sliced from an ingot and polished, cutting said semiconductor wafer along scribed lines between said elements to provide pellets, die-bonding said pellets to a lead frame or the like, making wire-bonding between the elements and the leads, molding them in resin or the like, and dividing said lead frame or the like.

The cutting of said semiconductor wafer is effected, as shown in FIGS. 10 and 11, by sticking a wafer W formed with a number of elements P to an adhesive sheet S, holding the adhesive sheet S by suction through suction holes H in an x-y table ST, dicing the wafer along scribed lines between the elements P by a dicer D having a diamond blade B, thereby dividing the individual elements P to provide pellets P.

However, the method of cutting the wafer W using the dicer D by sticking it to the adhesive sheet S has the following problems.

First, cutting by mechanically forming and proliferating material defects by a dicer D results in cracks or chippings produced in the wafer W or elements P during cutting, thus decreasing the yield of the pellets P. Although apparent cracks or chippings can be detected and removed by imaging as by a camera, microcracks or the like produced in the interior are difficult to detect by external imaging, leading to defectives found as by characteristic examination after assembly, thus resulting in wasting not only adhesive agents, heat dissipation plates, etc., during die-bonding, and wires and other materials during wire-bonding but also time, electricity, gas, etc., which result from applying unnecessary process treatments.

Second, cutting by the dicer D inevitably involves cooling since heat of friction is produced. Further, cuttings are produced by dicing and to wash away the cuttings, a large amount of cooling water is required during dicing. Further, because of the cooling water, the device has to be made water-tight and hence the device becomes complicated and expensive.

Third, recently, there has been a growing demand for thin type semiconductor devices, such as solar cells, IC cards, and stack type semiconductor devices. However, thinning the wafer W to cope with such demand for thinning lowers the mechanical strength, so that the wafer W tends to be damaged by the pressing force with which the wafer W is stuck to the adhesive sheet S and moreover the pellets P tend to be damaged when peeled from the adhesive sheet S after cutting.

Therefore, for thinning the pellets P, a production method, referred to as foredicing, as shown in FIGS. 12(A)–(D) has been developed. This method comprises the steps of (A) forming a number of elements P on the front side a of a relatively thick wafer W having a thickness t1 (for example, 500 $\mu$m), and sticking the back b to a first adhesive sheet S1, (B) dicing the wafer W from the front side a along scribed lines between elements P to form a grove G of predetermined depth, (C) peeling the adhesive sheet S on the back side, and sticking a second adhesive sheet S2 this time to the front a side, and (D) grinding the back b side to remove the material by an amount corresponding to a thickness t3 which exceeds the groove G formed by said dicing, thereby forming a thinned back c and at the same time dividing into individual pellets P, thus providing pellets P of desired thickness t2 (for example, 30–50 $\mu$m)

However, this production method referred to as foredicing is troublesome and greatly increases production costs. Further, when the pellets P are peeled from the adhesive sheet S2, the fact remains that the pellets P tend to be damaged.

Fourth, as shown in FIGS. 13(A)–(D), there has been developed another production method based on a batch adhesive agent layer, comprising the steps of (A) forming an adhesive agent layer AD of solder, resin or the like on the back of the wafer W in advance by batch-processing and sticking the adhesive agent layer AD side to the adhesive sheet S, (B) cutting it into pellets P by dicing, (C) peeling the pellets P from the adhesive sheet S to provide pellets P having the adhesive agent layer AD on the back, and (D) die-bonding the pellets P to a heat dissipation plate R, such as a lead frame, by utilizing the adhesive agent layer AD on the back.

Since this method is not required to feed an adhesive agent to the heat dissipation plate R meticulously during die-bonding, the die-bonding process becomes easier and can be reduced in time. Moreover, the adhesive agent layers of the pellets P bonded to the heat dissipation plate R become uniform in thickness, the height of the bonding position becomes constant in the subsequent wire bonding process. Therefore, the troublesome height adjustment of the bonding tool for each bonding place becomes unnecessary; thus, the production method allows quick, easy and reliable wire bonding. With the production method for thinning the pellets P, referred to as foredicing, described above, however, pellets P having the adhesive agent layer AD on the back cannot be obtained by forming the adhesive agent layer AD of solder, resin or the like on the back of the wafer W in advance. Further, in the case where the adhesive agent layer AD is formed of soft material, such as solder, the adhesive agent clogs the blade B, making the satisfactory dicing impossible.

Fifth, the method using a dicer D comprises the steps of setting the height of the blade B at a position deviated from the wafer W position, horizontally moving an x-y table with the wafer W held thereon by drawing while maintaining the blade height, thereby reciprocating the blade from a position outwardly of one end of the wafer W to a position outwardly of the other end and vice versa to dice the wafer W; therefore, non-square pellets are produced in large numbers around the periphery of the wafer W, making it necessary to sort out square pellets from non-square pellets, which is a troublesome process.

Thus, a method may be contemplated which, rather than mechanically cutting the wafer W by the dicer D having a diamond blade B, comprises the steps, as shown in FIGS. 14(A)–(C), of (A) irradiating $CO_2$ laser, YAG laser or other continuous wave laser, or long pulse laser L along scribed lines between the pellets P of a wafer W, (B) melting and scattering a laser-irradiated portion to form a groove G, and (C) repeatedly irradiating laser L to grow the groove G through the back so as to cut the wafer W.

However, since such laser L a continuous wave or has a large pulse width, laser irradiation results in a temperature rise in the vicinity of the laser-irradiated portion by heat conduction, producing a heat strain in the wafer W, which not only forms a cause of cracks or microcracks but also heats and melts up to the vicinity of the portion irradiated with the laser L. And since the melted portion is scattered together by the drastic scattering force of the melt of the portion irradiated with laser L, the width w of the groove G being formed becomes large and nonuniform. Further, since the angle of inclination of the groove G is small, it is necessary to set the scribed line width between the elements P at a large value, resulting in a decrease in the pellet yield. Moreover, the melted wafer material deposits on the edge of the groove G or scatters in the vicinity of the laser-irradiated portion to stick to the electrodes or the like of the elements (pellets) P. Further, since the angle of inclination of the lateral end surface Pa of the pellet P obtained is small, there has been a problem that it sometimes constitutes obstacle depending on the use of the pellets P.

SUMMARY OF THE INVENTION

Accordingly, an object of the invention is to provide a substrate cutting method using laser irradiation, wherein the prior art problems described above are solved.

A substrate cutting method of the invention is characterized by irradiating a substrate with ultrashort pulse laser to cut it.

FIG. 4 is a block diagram of an ultrashort pulse laser device. Trying to directly amplify titanium sapphire laser output would result in the peak strength being too high, damaging the optical elements; therefore, a chirped pulse amplification method is used. The chirped pulse amplification method refers to a technique comprising the steps, as shown in FIG. 5, of (1) causing the pulse width of ultrashort pulse laser TL incident on a regenerative amplifier RA to chirp by using a diffraction grating pair, thereby (1) increasing the pulse width more than thousands of times (pulse stretching), (2) amplifying while keeping the peak power low (pulse amplification), and then (3) compressing to the original pulse width by the diffraction grating pair (pulse compression). The finally amplified pulse, for example, has an energy of 2 mJ, a pulse width of 130 fs, and a repetition rate of 10 Hz, and the peak strength is amplified to 15 GW. Since the peak strength of titanium sapphire laser is 107 kW, it follows that it has been amplified about 100,000 times.

The substrate cutting method which irradiates ultrashort pulse laser, unlike mechanical cutting using a dicer having a diamond blade, has the possibility of pellets being scattered by mechanical force during cutting, so that the conventional adhesive sheet is unnecessary and can be dispensed with. Therefore, material costs can be saved and moreover since the sticking process can be reduced, process costs are low. Further, because of dry process, the cleaning process can be omitted. Further, ultrashort pulse laser, as compared with the conventional method of cutting the wafer W by irradiating $CO_2$ laser, YAG laser or other continuous wave laser or pulse laser L, has a short laser pulse width, so that the heat conduction is low; therefore, and there is almost no rise in the substrate temperature in the vicinity of the laser-irradiated portion; thus precluding a decrease in yield due to cracking caused by thermal strain produced by a rise in the temperature of the substrate. Since a narrow groove can be formed only in the portion irradiated with laser, the scribed line width can be designed to be narrow, thus increasing the number of elements per substrate. Moreover, since the possibility of the melted substrate material scattering in the vicinity of the laser-irradiated portion is decreased, the yield of pellets can be increased.

That is, the thermal diffusion length $L_D$ during laser irradiation is $L_D=(D\tau_1)^{1/2}$ where D is the diffusion coefficient of the material and $\tau_1$ is the pulse width of the laser. Here, $D=k_T/\rho c_p$ where $k_T$, $\rho$, and $c_p$ are heat conductivity, density and heat capacity, respectively. Thus, since the heat diffusion length $L_D$ is proportional to the square root of the pulse width $\tau_1$, ultrashort pulse laser irradiation results in the heat diffusion length being greatly reduced as compared with the prior art during laser irradiation, and when the pulse width becomes less than picoseconds, heat diffusion can be almost entirely neglected.

A substrate cutting method of the invention is characterized in that the pulse width of said ultrashort pulse laser is less than 1 picosecond.

According to the substrate cutting method of the invention, the pulse width is less than 1 picosecond. For example, irradiation with femtosecond pulse from a titanium sapphire laser source results in almost no rise in temperature being found in the vicinity of the portion irradiated with laser 7 when the substrate 1 is irradiated with the laser 7, as shown in FIG. 6(A). Therefore, there is formed a groove 8 having steep lateral surfaces only in the portion irradiated with the laser 7, as shown in FIG. 6(B). Irradiation with the laser 7 with a repletion frequency of 1 kHz–100 kHz results in pellets 2 being obtained with the lateral end surfaces 2a having almost no slope, as shown in FIG. 6(C). Therefore, the aspect ratio of the groove 8 is high, and the scribed line width of the substrate 1 can be set at a small value, making it possible to increase the number of pellets 2 per substrate and to improve the yield of the pellets 2. When this is compared with FIGS. 14(A)–(C) described above showing the conventional substrate cutting method using laser, the differences are obvious. Further, there is almost no rise in the temperature of the substrate, nor is the deposition or scatter of melted substrate material in the vicinity of the laser-irradiated portion.

A substrate cutting method of the invention is characterized in that the surface layer of the substrate which is in an improved state is irradiated with said laser.

According to the substrate cutting method of the invention, laser irradiation is effected in an improved state in which the temperature of the surface layer of the substrate is raised to lower the laser penetration; therefore, the laser absorption coefficient of the improved surface layer becomes high, making it possible to improve the processing accuracy.

The invention of the invention is characterized in that the ultra short pulse laser emits a plurality of pulses having an interpulse separation of 3 to 30 picoseconds.

In the method for cutting a substrate of the invention, scattered particles produced by a preceding pulsed laser beam are prevented from re-adhering to the periphery of the hole which may be caused by the subsequent pulsed laser beam. It is thus made possible to reduce the height of a swelling around the hole.

A substrate cutting method of the invention is characterized in that said substrate is a semiconductor wafer formed with a number of elements and said ultrashort pulse laser is irradiated along the scribed lines between said elements.

According to the substrate cutting method of the invention, since the scribed line width between elements can be reduced as described above, the number of pellets per semiconductor wafer can be increased, and moreover since no cracking or chipping occurs in the pellets, the pellet yield can be greatly improved and so can be the pellet strength.

A substrate cutting method of the invention is characterized in that the thickness of said semiconductor wafer is not more than 50 μm.

According to the substrate cutting method of the invention, a semiconductor device having thinned pellets such as an IC card, now in great demand, or of the stack type can be produced without employing the production method referred to as foredicing.

A substrate cutting method of the invention is characterized in that said semiconductor wafer has a batch-processed adhesive agent layer on the back.

According to the substrate cutting method of the invention, since the pellets obtained by cutting the semiconductor wafer have batch-processed adhesive agent layers on the back, the troublesome operation of meticulously feeding an adhesive agent such as solder or resin to a lead frame or the like during die-bonding to the lead frame or the like can be omitted. Moreover, the presence of the adhesive agent layer of uniform thickness on the back eliminates the possibility of the pellets die-bonded to a lead frame or the like being inclined. In the subsequent wire bonding process, the bonding height position becomes constant, thereby making unnecessary the troublesome operation of adjusting the bonding tool height for each bonding place, thereby not only facilitating the bonding operation but also making the bonding strength in each bonding place constant; thus, a semiconductor device having uniform and superior characteristics is obtained.

A substrate cutting method of the invention is characterized in that the back of said semiconductor wafer is drawn by an x-y table.

According to the substrate cutting method of the invention, since the semiconductor wafer is drawn to the x-y table by static electricity or vacuum suction force during cutting, the aligned state of the elements in the wafer can be retained in the pellets after cutting; therefore, the batch-movement of the plurality of pellets onto a tray or the like after cutting can be easily realized and so can be the successive pick-up of pellets from the x-y table after cutting to die-bond them directly to a lead frame or the like.

A substrate cutting method of the invention is characterized in that said laser is irradiated to the semiconductor wafer excluding the peripheral portion thereof.

According to the substrate cutting method of the invention, since the peripheral portion of the semiconductor wafer is not irradiated with laser, the laser irradiation time can be correspondingly reduced to improve the throughput. Moreover, since the peripheral portion of the wafer is not cut, there is no possibility of a number of non-square pellets due to non-square elements being produced in the peripheral portion of the wafer as in the case of a cutting method using a dicer, and hence the processing of the same is unnecessary, facilitating the production.

DESCRIPTION OF THE PREFERRED EMBODIMENTS

Figure 1:
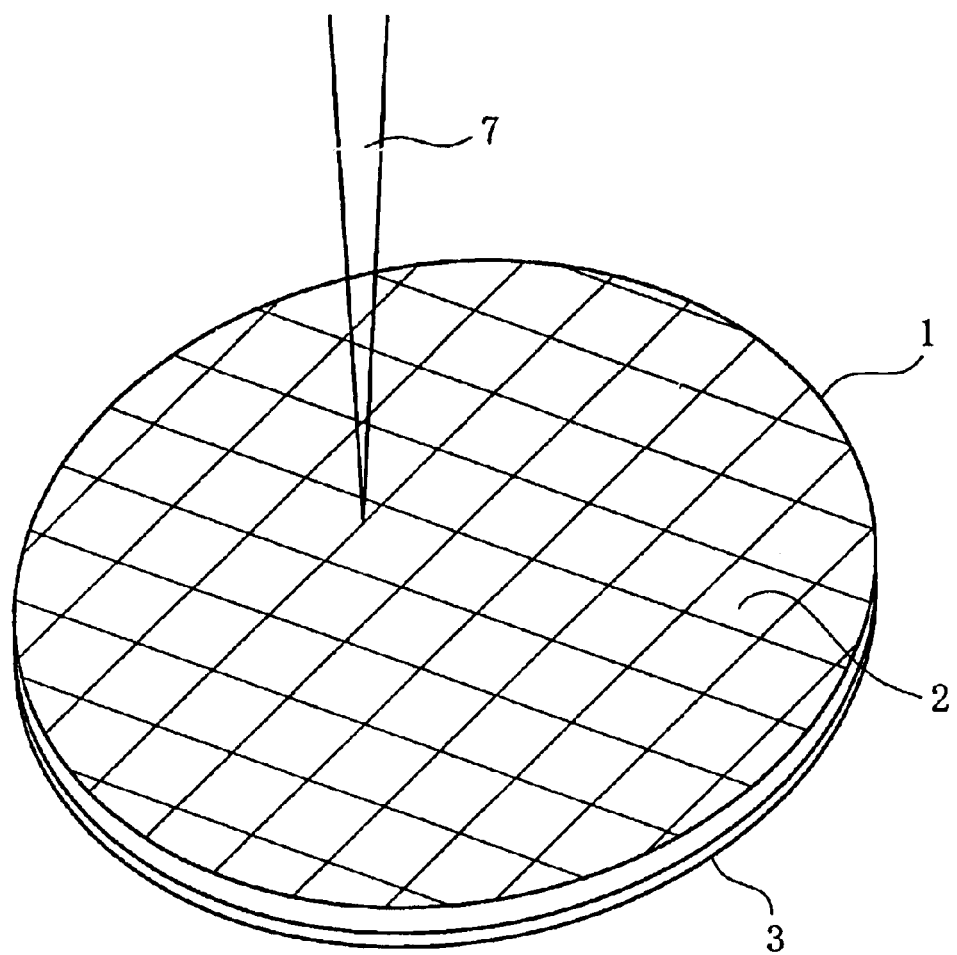
FIG. 1 is a schematic perspective view for explaining a substrate cutting method according to an embodiment of the invention.
Figure 2:
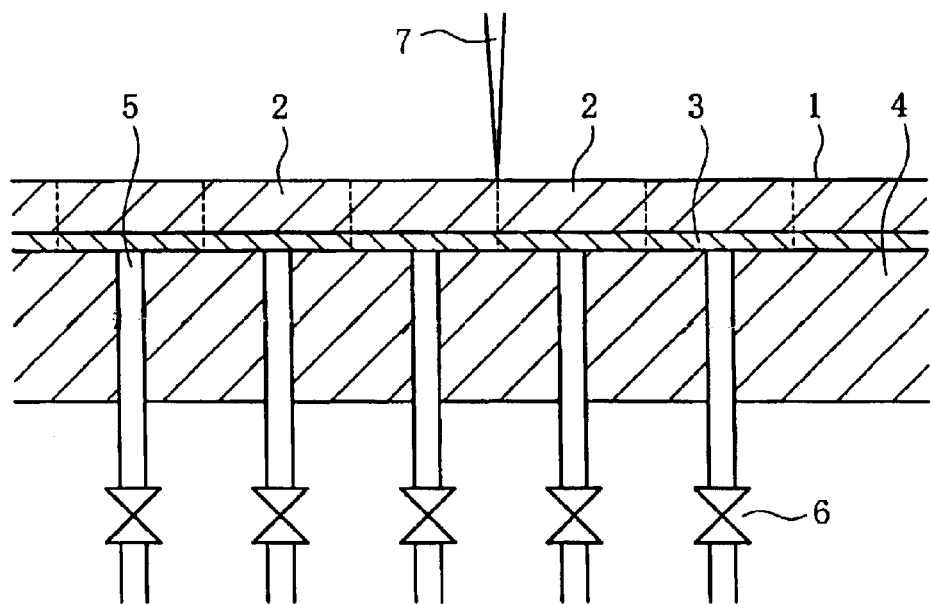
FIG. 2 is a principal enlarged sectional view for explaining a substrate cutting method according to an embodiment of the invention.

An embodiment of the invention will now be described with reference to the drawings. FIG. 1 shows a schematic diagram for explaining the substrate cutting method of the invention. In FIG. 1, the numeral 1 denotes a semiconductor wafer, shown as an example of a substrate, having a thickness of not more than 50 μm (hereinafter referred to as wafer), with a number of elements P formed as by wellknown impurity diffusion, the back thereof having an adhesive agent layer 3 formed by batch processing of solder, resin or the like. The back of the wafer 1 (the adhesive agent layer 3 side) is drawn to a x-y table 4, as shown in FIG. 2, rather than stuck to an adhesive sheet. The drawing to the table 4 may be by electrostatic attraction or by vacuum suction. Particularly when the elements 2 are relatively large in size, an arrangement, as shown in FIG. 2, comprising a plurality of suction holes 5 and valves 6 corresponding to the elements P formed on the wafer 1 may be used. In addition, to cope with multiple kinds of wafers 1, an arrangement may be made by constructing the upper portion of the x-y table 4 to be divisible and preparing a plurality of upper portions which differ in the pitch of the suction holes 5 so as to allow the upper portions to be exchanged when the kind of the wafer is changed.

Figure 3:
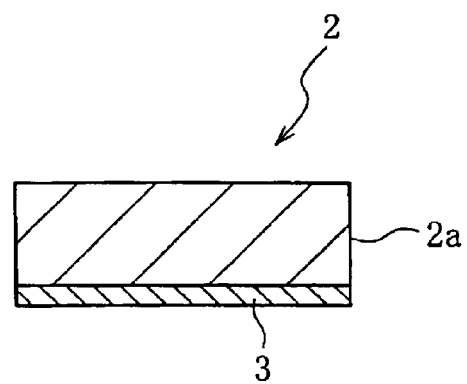
FIG. 3 is an enlarged sectional view of a pellet obtained by a substrate cutting method according to an embodiment of the invention.
Figure 4:
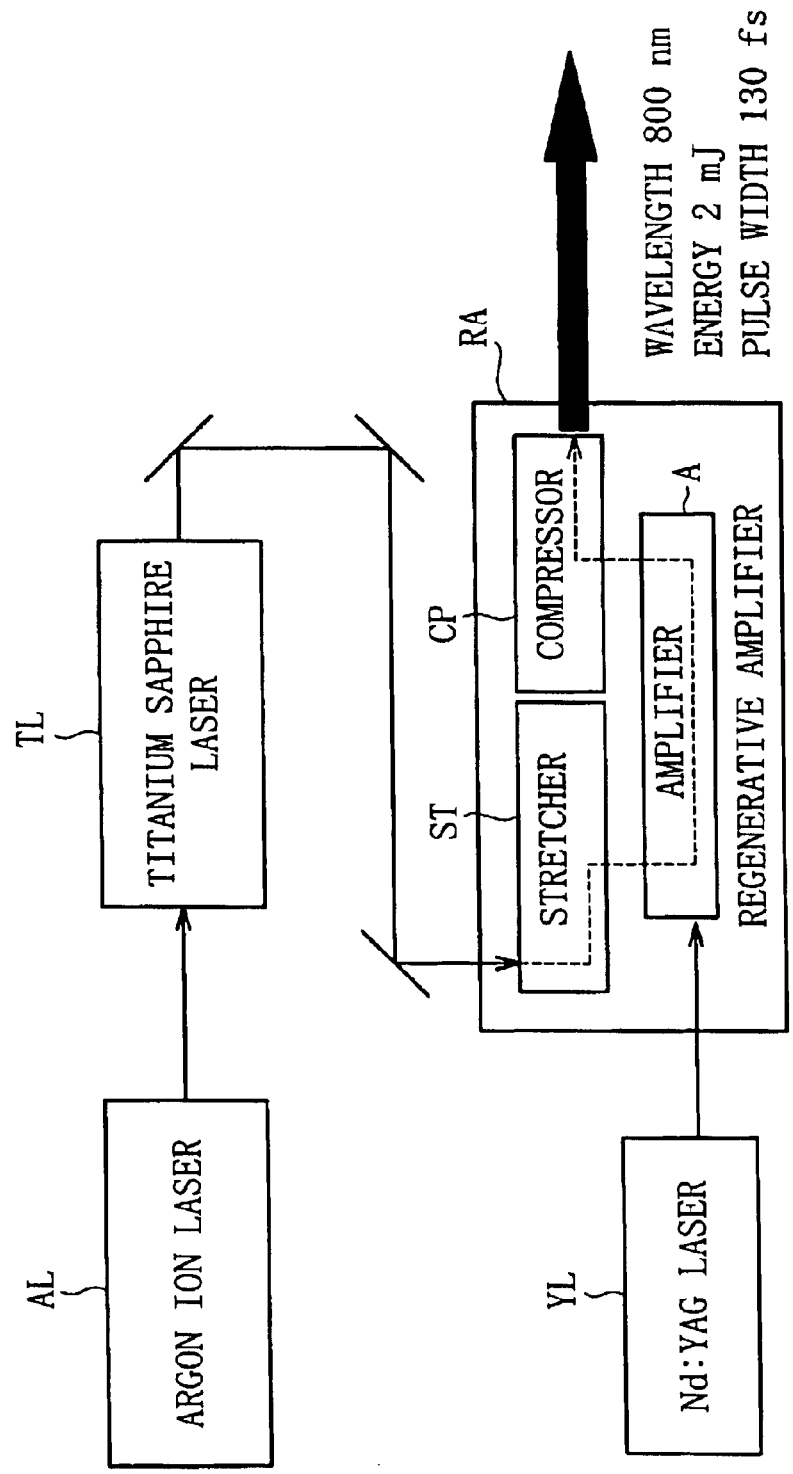
FIG. 4 is a block diagram of an ultrashort pulse laser device used in the invention.
Figure 5:
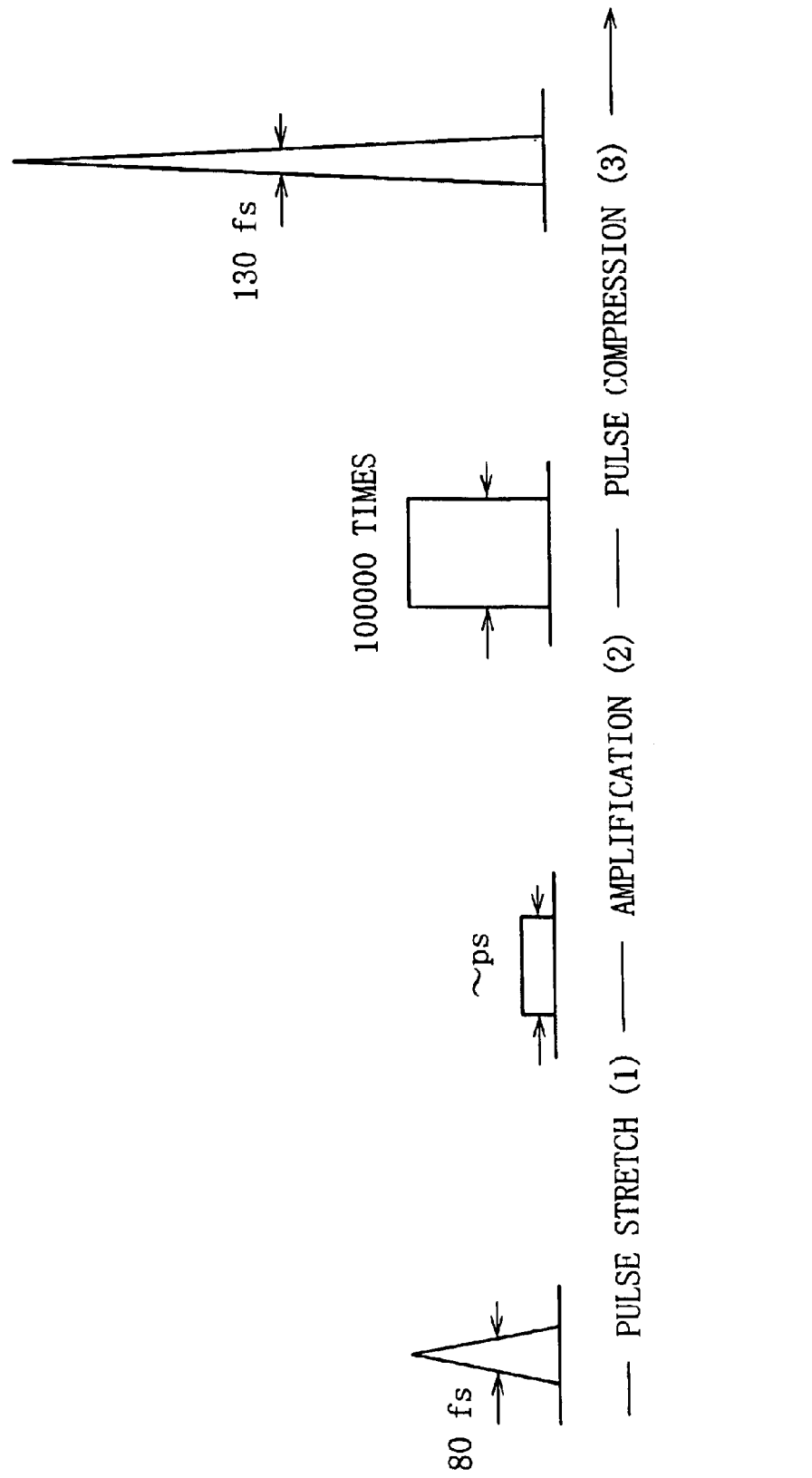
FIG. 5 is an explanatory view of a chirped pulse amplification stage for ultrashort pulse laser used in the invention.
Figure 6A:
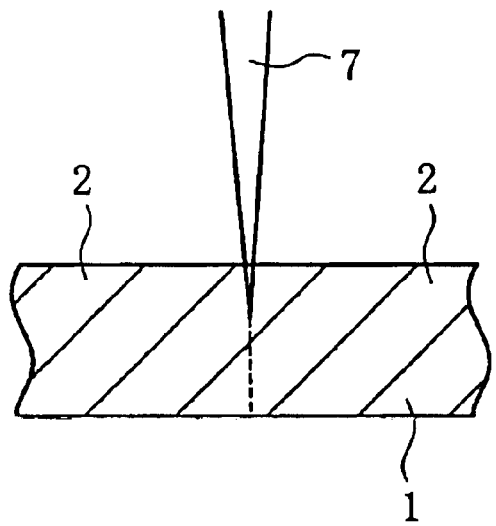
FIG. 6(A) is a principal enlarged sectional view taken during laser irradiation in the substrate cutting method of the invention, (B) is a principal enlarged sectional view taken in the course of groove formation in the substrate cutting method of the invention, and (C) is a principal enlarged sectional view taken after groove formation in the substrate cutting method of the invention.
Figure 6B:
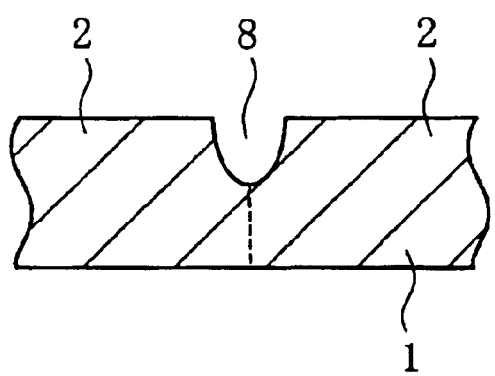
Figure 6C:
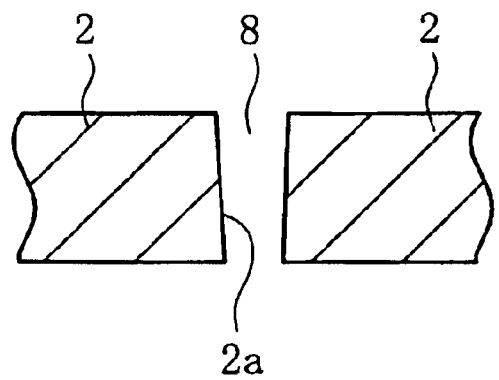

In this manner, the wafer 1 drawn to the table 4 is cut along the scribed lines between elements P thereon by repeatedly irradiating it with femtosecond laser (with pulse widths of 780–800 nm) 7 having a pulse width of not more than 1 picosecond at 1 kHz–100 kHz from a titanium sapphire laser source. Thereupon, as already described with reference to FIGS. 6(A)–(C), a groove 8 having steep lateral end surface is formed, and, as shown in FIG. 3, a number of pellets 2 are obtained whose lateral end surfaces 2a are substantially right-angled and which have a batch-processed adhesive agent layer 3 on the back.

Figure 12A:
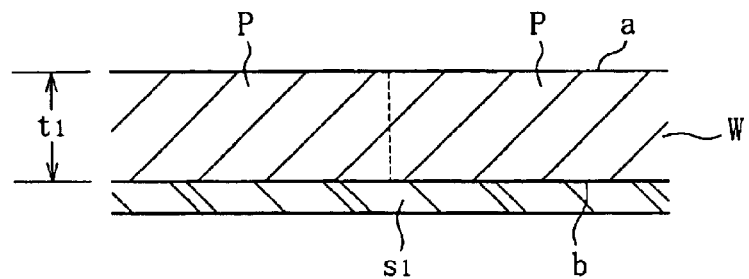
FIG. 12(A) is a principal enlarged sectional view showing a semiconductor wafer stuck to a first adhesive sheet for explaining another conventional substrate cutting method using a dicer, (B) is a principal enlarged sectional view after dicing, (C) is a principal enlarged sectional view showing a state in which after the first adhesive sheet on the back has been peeled, a second adhesive sheet is stuck to the front, and (D) is a principal enlarged sectional view showing a semiconductor wafer thinned by polishing its back.
Figure 12B:
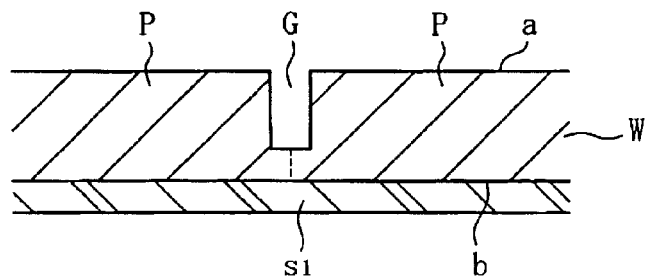
Figure 12C:
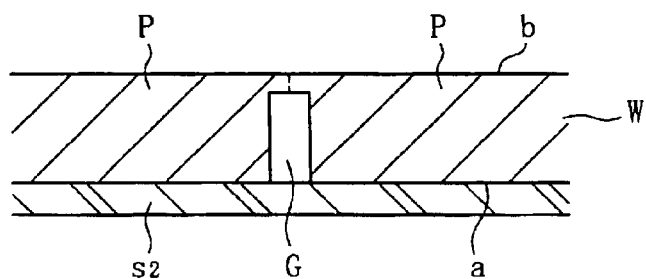
Figure 12D:
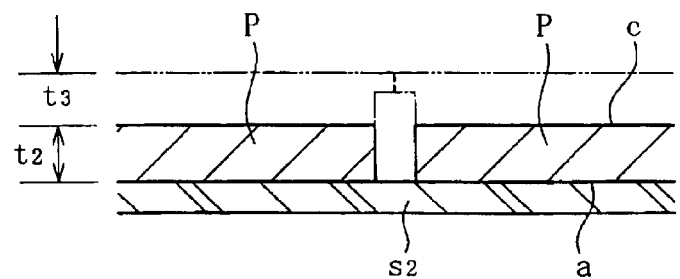
Figure 13A:
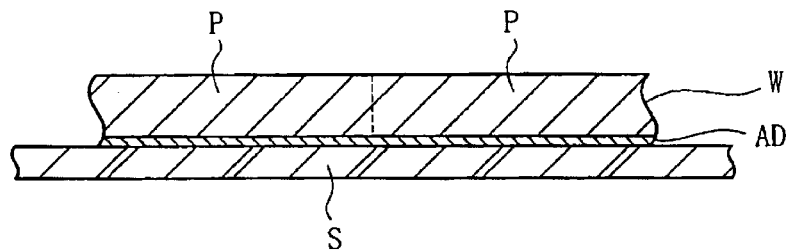
FIG. 13(A) is a principal enlarged sectional view showing a state in which a semiconductor wafer having a batch-processed adhesive agent layer on the back is stuck to an adhesive sheet, for explaining a still another conventional substrate cutting method using a dicer, (B) is a principal enlarged sectional view after dicing, (C) is a principal enlarged sectional view of a pellet obtained, and (D) is a principal enlarged sectional view showing a pellet die-bonded to a heat dissipation plate.
Figure 13B:
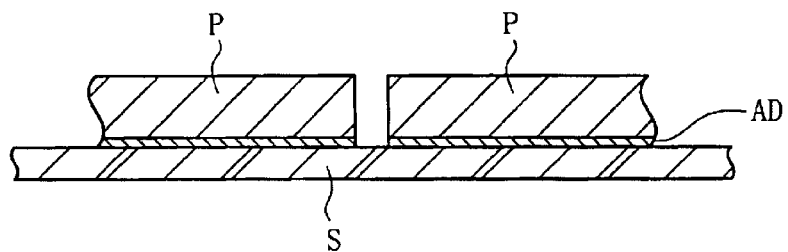
Figure 13C:
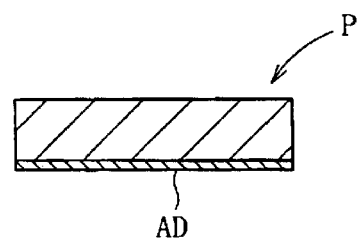
Figure 13D:
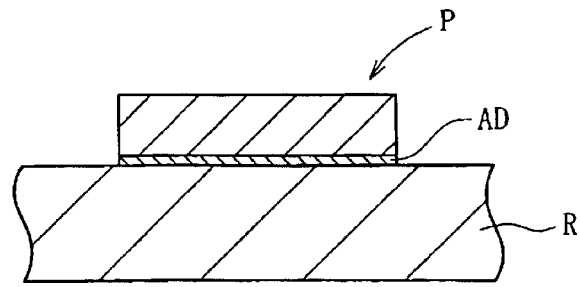
Figure 14A:
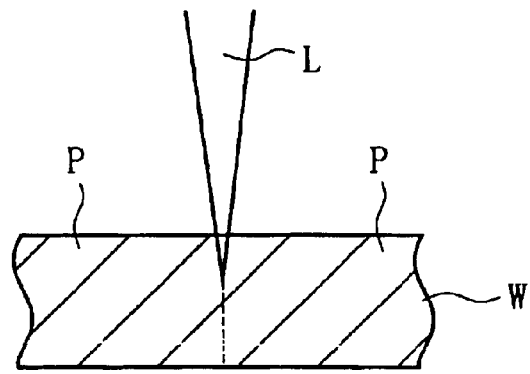
FIG. 14(A) is a principal enlarged sectional view taken during laser irradiation, for explaining a conventional substrate cutting method using laser irradiation, (B) is a principal enlarged sectional view showing an intermediate stage of groove formation, and (C) is a principal enlarged sectional view taken after groove formation.
Figure 14B:
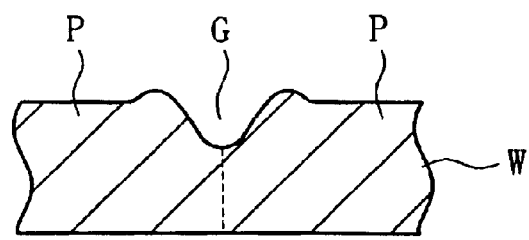
Figure 14C:
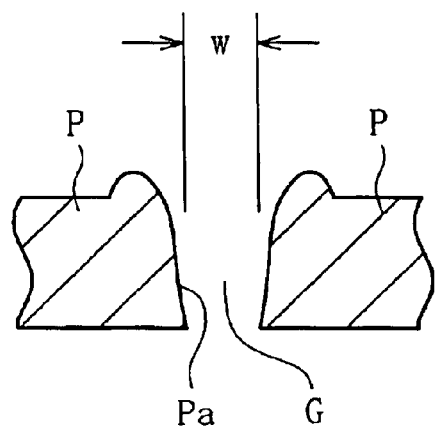

Therefore, if the pellet 2 is die-bonded to a heat dissipation plate R, such as a lead frame or the like, (see FIG. 12(D)) by utilizing the adhesive agent layer 3, the pellet 2 can be die-bonded without feeding an adhesive agent to the heat dissipation plate R, as described above. Moreover, in the case where the pellet 2 is die-bonded to the heat dissipation plate R in this manner, as compared with the case of die-bonding the pellet by feeding an adhesive agent to the heat dissipation plate, no inclination is caused in the pellet 2 since the thickness of the adhesive agent layer 3 on the back is uniform, so that in the subsequent wire-bonding process, the troublesome operation of adjusting the height of the bonding tool for each bonding place can be omitted, facilitating the bonding operation and reducing the amount of time needed for bonding operation. Moreover, since the bonding strengths in each bonding place can be made uniform and increased, a semiconductor device having constant characteristics is obtained.

Figure 7:
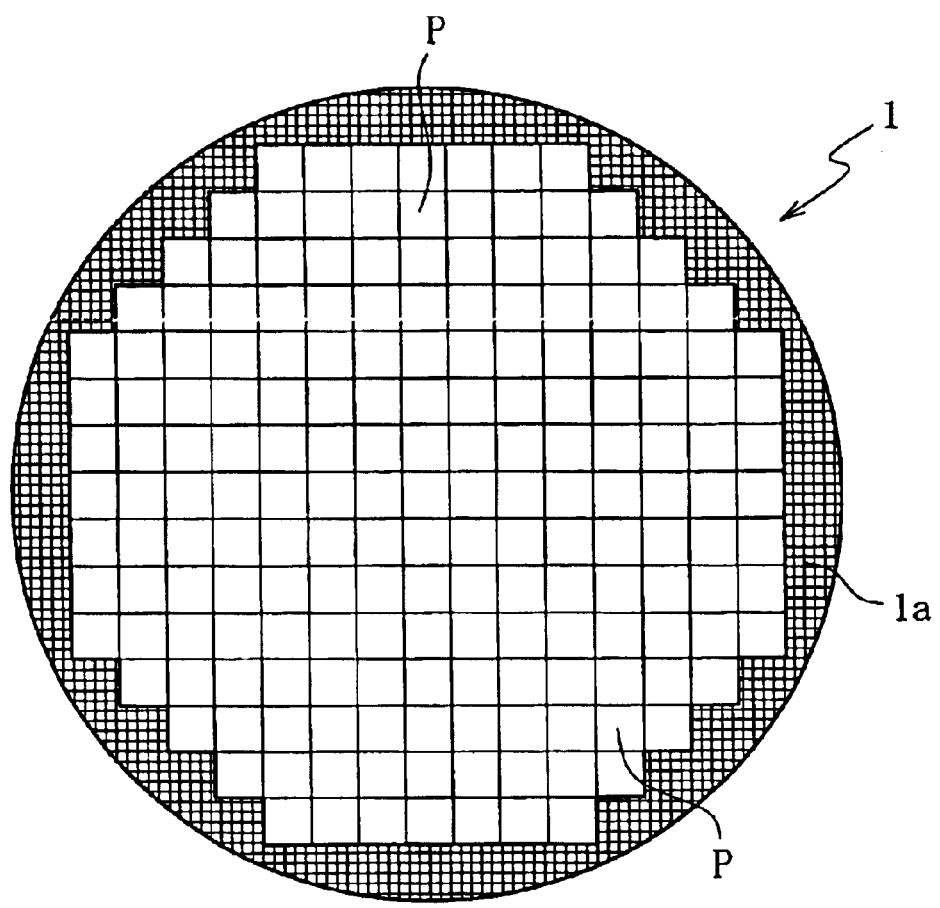
FIG. 7 is a plan view of a semiconductor wafer for explaining another embodiment for cutting the semiconductor wafer by the substrate cutting method of the invention.

In addition, irradiation of the wafer 1 with laser 7 may be effected from one to the other end of the wafer 1 along a scribed line between elements 2; however, if only a region excluding the non-square element portion (shaded in the drawing) 1a around the periphery wafer 1, as shown in FIG. 7, is irradiated, there is an advantage that the post operation is simplified since there is formed no non-square pellet due to the non-square elements in the peripheral portion.

Further, the surface layer of the wafer 1 may be improved during laser 7 irradiation. That is, the substrate changes in the degree of penetration of the laser 7 according to temperature such that the higher the temperature, the lower the degree of laser penetration, so that absorption coefficient for the laser 7 is improved. For example, the surface layer can be improved by a depth of 1–5 nm for metal and 4–5 $\mu$m for silicon. This surface layer improvement can be made by the heating of the surface layer of the wafer 1. This heating may be effected by embedding a heater in the x-y table 4 or by preheating the wafer 1 with a hot plate, and is followed by irradiation with the laser 7. Alternatively, a laser head for the focused ultrashort pulse laser 7 for cutting maybe combined with an improving laser head for unfocussed, continuous wave or large-pulse-width laser, thereby irradiating the surface layer of the wafer 1 with improving laser to improve it and at the same time with or before or after this irradiation, irradiating it with the cutting laser 7 to cut the wafer.

In addition, in this heating for improving the surface layer of the wafer 1, unlike elevating the temperature of the laser-irradiated portion radically and with a large output as in the case of irradiation with a conventional continuous wave or large-pulse-width laser L, the heat conduction is too low to form a heat strain, so that there is no danger of forming cracks or microcracks.

In the present invention, the ultra short pulse laser emits pulsed laser beams preferably at interpulse separations of 3 to 30 picoseconds. The reasons for this are described below in more detail with reference to the results of an experiment that employed a double pulse laser beam emitted at predetermined interpulse separations.

Experimental Conditions

Substrate to be cut: Silicon substrate 50 $\mu$m in thickness
Ultra short pulse laser: Titanium sapphire laser
Pulse width $\tau$: 120 fs
Center frequency $\lambda$: 800 nm
Pulse energy E: 0.01 mJ/pulse
Work distance WD: 100 mm
Lens focal length f: 100 mm
Number of times of laser applications N: 18

Figure 8:
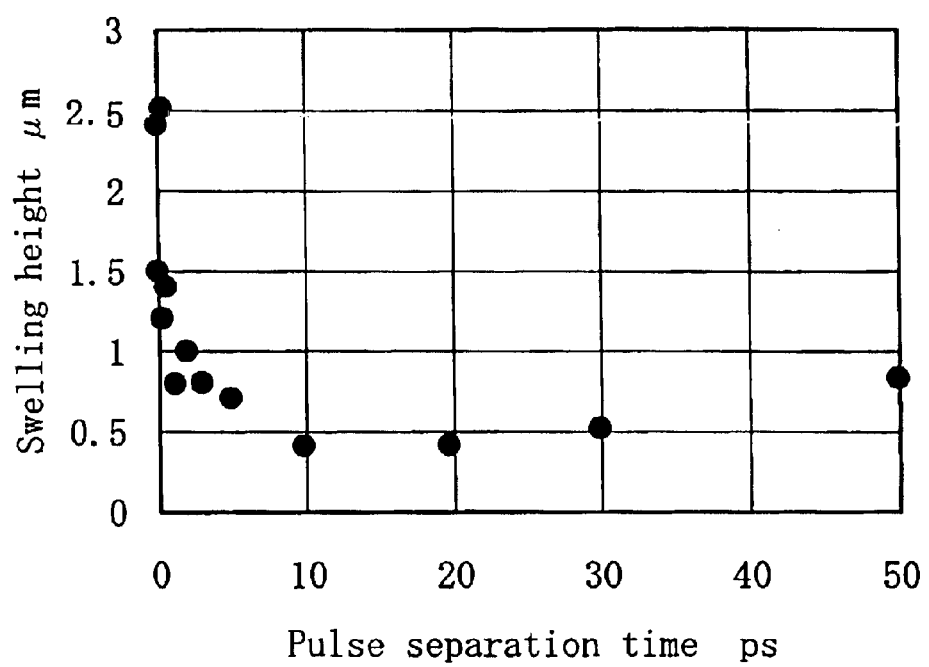
FIG. 8 is a diagram illustrating the pulse separation versus swelling height characteristic for a double pulse laser beam emitted by an ultra short pulse laser at interpulse separations of 0 to 50 picoseconds.

The aforementioned ultra short pulse laser provided double pulse laser beams, each pulse having a pulse energy of 0.01 mJ/pulse. At interpulse separations of more than 3 picoseconds, a swelling around the hole started to become gradually lower in height. At interpulse separations of 10 to 20 picoseconds, the swelling was reduced to a minimum height of 0.5 $\mu$m or less. However, at interpulse separations of more than 30 picoseconds, the swelling started again to become gradually higher. FIG. 8 shows the relationship between the pulse separation and the swelling height.

As described above, the swelling around the hole starts to become gradually lower in height at interpulse separations of more than 3 picoseconds. This phenomenon is considered due to the effect that vaporized particles start to scatter 3 picoseconds after having been irradiated with a first pulse, and the particles are then irradiated with the second pulse to be thereby prevented from re-adhering to the periphery of the hole.

On the other hand, at interpulse separations of 10 to 20 picoseconds, the swelling is reduced to a minimum height. This is considered due to the fact that scattered particles produced by the first pulse has the highest concentration 10 to 20 picoseconds after having been irradiated with the first pulse, and then the second pulse effectively prevents the scattered particles from re-adhering to the periphery of the hole.

It is assumed that when directed at the surface of the hole being formed with the first pulse, the second pulse is reduced in its pulse energy due to absorption by the scattered particles and the surface of the hole has a thin molten layer spread thereon. It is thus conceivable that this increases the absorption coefficient of the second pulse and thereby causes the second pulse to provide less amount of a molten layer than one to be formed by a single pulse, resulting in a swelling reduced in height.

At interpulse separations of 30 picoseconds, abrasion due to the first pulse turns converging. This conceivably causes the scattered particles to start adhering to the periphery of the hole as debris and thereby increasing the swelling in height.

At interpulse separations of up to 50 picoseconds, the scattered particles present on the optical axis of the second pulse are reduced in concentration, thereby reducing the energy loss of the second pulse. Furthermore, it is conceivable that the surface of the hole formed by the first pulse has an absorption coefficient approaching the steady state, thereby causing the hole to be drilled deeper.

Figure 9A:
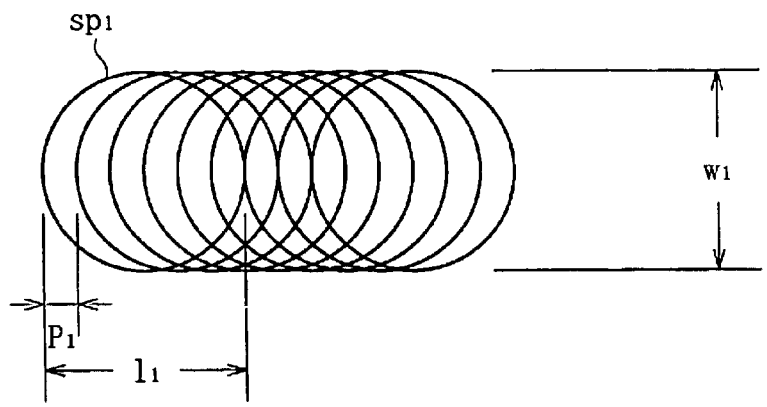
FIG. 9(A) is a plan view showing an ultrashort pulse laser irradiation state in a circular spot in the substrate cutting method of the invention, (B) is a plan view showing an ultrashort pulse laser irradiation state in an elliptic spot in the substrate cutting method of the invention, and (C) is a plan view showing an ultrashort pulse laser irradiation state in an inclined elliptic spot in the substrate cutting method of the invention.
Figure 9B:
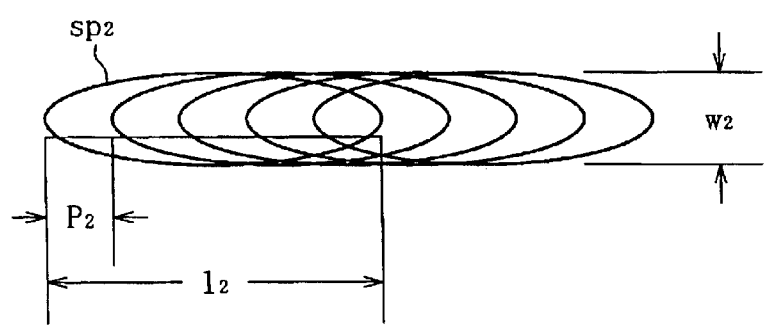
Figure 9C:
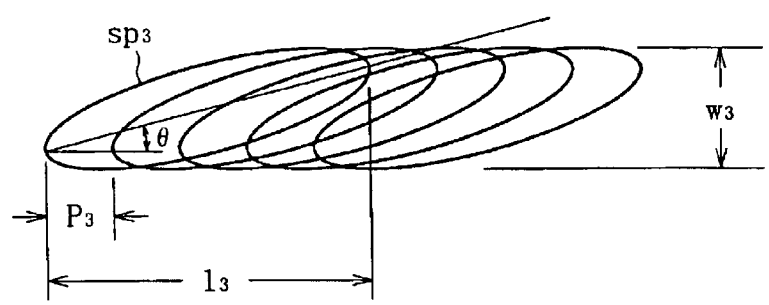
Figure 10:
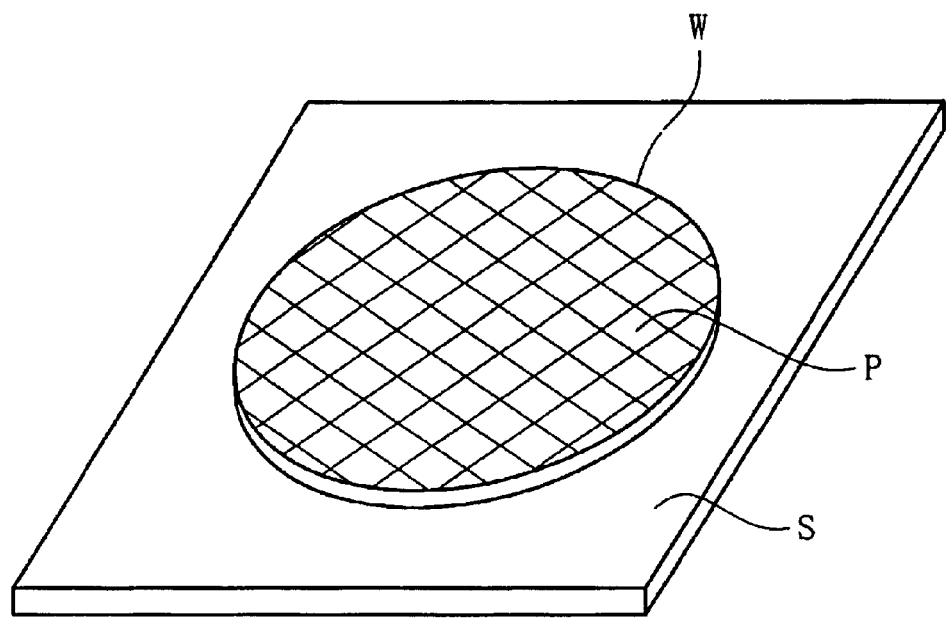
FIG. 10 is a perspective view for explaining a conventional substrate cutting method using a dicer.
Figure 11:
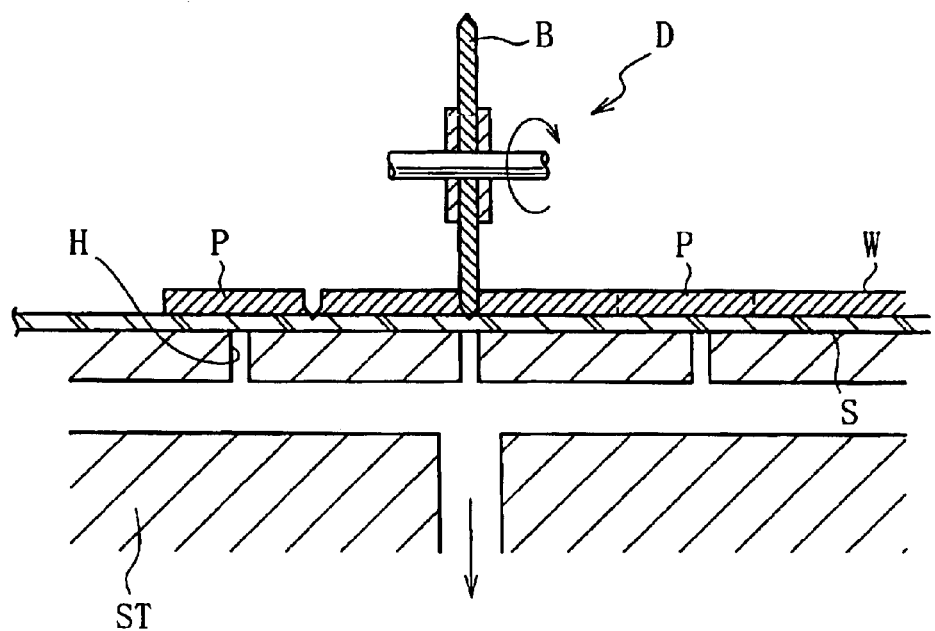
FIG. 11 is an principal enlarged sectional view for explaining a conventional substrate cutting method using a dicer.

Further, the spot shape of the ultrashort pulse laser used in the invention can be optionally set as shown in FIGS. 9(A)–(C). That is, when a circular spot sp1 shown in FIG. 9(A) is used for irradiation, a dimension $1_1$ can be processed for each laser shot, the irradiation pitch being p1, the processing width being w1. In the case of an elliptic spot sp2 shown in FIG. 9(B), the dimension which can be irradiated with one shot of laser is $1_2$, as compared with the case of the circular spot sp1 shown in FIG. 9(A); thus, it can be made larger than the dimension $1_1$ for the circular spot sp1, and the irradiation pitch p2 can be made larger than p1, making it possible to improve the processing rate. In addition, when the laser power is the same, the processing width w2 becomes smaller than in the case of the circular spot sp1 shown in FIG. 9(A). Therefore, this is effective when it is desired to reduce the processing width. Further, in the case of an elliptic spot sp3 shown in FIG. 9(C) inclined by an angle θ, there is an advantage that the processing width w3 ($=1_2\sin\theta$) can be optionally set by changing the angle of inclination, θ.

Further, in the invention, a dust collecting electrode which is positively or negatively charged may be installed in the vicinity of the laser irradiator. With this arrangement, charged fragments produced by laser irradiation can be electrostatically attracted by the dust collecting electrode, thus preventing the charged fragments from depositing in the vicinity of the laser irradiator.

Since the substrate cutting method of the invention is characterized by irradiating a substrate with ultrashort pulse laser to cut it, as compared with a method for dicing using a dicer having a diamond blade, it becomes unnecessary to stick the substrate to an adhesive sheet, no cracking or chipping is involved in cutting, the pellet strength can be increased, and cooling water for cooling and washing out chips during cutting becomes unnecessary. Further, production of thin type pellets meeting the need for thinned type or pellets having a batch-processed adhesive agent layer on the back becomes possible. Further, as compared with the conventional method of cutting a wafer by irradiating the latter with continuous wave laser, such as $CO_2$ laser or YAG laser, or pulse laser having large pulse width, cutting is possible only by heating the laser-irradiated portion, so that microcracks due to heat strain hardly occur. Further, since the lateral end surfaces of the cut groove are steep, the width of scribed lines can be reduced, improving the yield of pellets per substrate.

What is claimed is:

1. A substrate cutting method characterized by irradiating a silicon substrate with an ultrashort pulse laser to cut it, wherein a pulse width of said ultrashort pulse laser is equal to or less than 1 picosecond, and said ultrashort pulse laser emits a plurality of pulses having an interpulse separation of 3 to 30 picoseconds.

2. A substrate cutting method as set forth in claim 1, characterized in that a surface layer of the substrate is irradiated with said laser.

3. A substrate cutting method as set forth in claim 1, characterized in that said substrate is a semiconductor wafer formed with a number of elements and said ultrashort pulse laser is irradiated along the scribed lines between said elements.

4. A substrate cutting method as set forth in claim 2, characterized in that said substrate is a semiconductor wafer formed with a number of elements and said ultrashort pulse laser is irradiated along the scribed lines between said elements.

5. A substrate cutting method as set forth in claim 1 or claim 2, characterized in that said substrate is a semiconductor wafer formed with a number of elements and said ultrashort pulse laser is irradiated along the scribed lines between said elements.

6. A substrate cutting method as set forth in claim 5, characterized in that the thickness of said semiconductor wafer is equal to or less than 50 μm.

7. A substrate cutting method as set forth in claim 5, characterized in that said semiconductor wafer has a batch-processed adhesive agent layer on the back.

8. A substrate cutting method as set forth in claim 6, characterized in that said semiconductor wafer has a batch-processed adhesive agent layer on the back.

9. A substrate cutting method as set forth in claim 5, characterized in that the back of said semiconductor wafer is drawn by an x-y table.

10. A substrate cutting method as set forth in claim 6, characterized in that the back of said semiconductor wafer is drawn by an x-y table.

11. A substrate cutting method as set forth in claim 8, characterized in that the back of said semiconductor wafer is drawn by an x-y table.

12. A substrate cutting method as set forth in claim 5, characterized in that said laser is irradiated to the semiconductor wafer excluding the peripheral portion thereof.

13. A substrate cutting method as set forth in claim 6, characterized in that said laser is irradiated to the semiconductor wafer excluding the peripheral portion thereof.

14. A substrate cutting method as set forth in claim 8, characterized in that said laser is irradiated to the semiconductor wafer excluding the peripheral portion thereof.

15. A substrate cutting method as set forth in claim 11, characterized in that said laser is irradiated to the semiconductor wafer excluding the peripheral portion thereof.

* * * * *